United States Patent
Daval et al.

(10) Patent No.: US 7,446,019 B2
(45) Date of Patent: Nov. 4, 2008

(54) METHOD OF REDUCING ROUGHNESS OF A THICK INSULATING LAYER

(75) Inventors: Nicolas Daval, Grenoble (FR);
Sebastien Kerdiles, Saint-Ismier (FR);
Cécile Aulnette, Grenoble (FR)

(73) Assignee: S.O.I. Tec Silicon on Insulator Technologies, Bernin (FR)

( * ) Notice: Subject to any disclaimer, the term of this patent is extended or adjusted under 35 U.S.C. 154(b) by 149 days.

(21) Appl. No.: 11/481,701

(22) Filed: Jul. 5, 2006

(65) Prior Publication Data
US 2007/0020947 A1    Jan. 25, 2007

(30) Foreign Application Priority Data
Jul. 13, 2005   (FR) .................................... 05 07573

(51) Int. Cl.
*H01L 21/30* (2006.01)
*H01L 21/46* (2006.01)
(52) U.S. Cl. .......................... 438/459; 438/455; 438/759
(58) Field of Classification Search ................ 438/758, 438/761, 765, 778, 783, 459, 455, 759
See application file for complete search history.

(56) References Cited

U.S. PATENT DOCUMENTS

| | | | | |
|---|---|---|---|---|
| 6,962,858 | B2 * | 11/2005 | Neyret et al. | 438/471 |
| 6,982,210 | B2 * | 1/2006 | Ghyselen et al. | 438/459 |
| 7,256,075 | B2 * | 8/2007 | Ghyselen et al. | 438/149 |
| 2006/0035445 | A1 * | 2/2006 | Neyret et al. | 438/472 |
| 2006/0076559 | A1 * | 4/2006 | Faure et al. | 257/49 |
| 2008/0042077 | A1 * | 2/2008 | Schmitt | 250/492.2 |

OTHER PUBLICATIONS

D.M. Hansen et al., "Chemical Role Of Oxygen Plasma In Wafer Bonding Using Borosilicate Glasses," Applied Physics Letters, vol. 79, No. 21, pp. 3413-3415 (2001).
D.M. Hansen et al., "Plasma Induced Chemical Changes at Silica Surfaces During Pre-Bonding Treatments", vol. 681E, Materials Research Society, pp. 12.2.1-12.2.6 (2001).
D. Pasquartello et al., "Surface Energy As A Function Of Self-Bias Voltage In Oxygen Plasma Wafer Bonding," Sensors and Actuators, vol. 82. pp. 239-244 (2000).
H. Moriceau et al., "Interest Of A Short Plasma Treatment To Achieve High Quality Si-SiO$_2$-Si Bonded Structures," Abstract No. 1006, ECS (2003).

* cited by examiner

*Primary Examiner*—Walter L. Lindsay, Jr.
*Assistant Examiner*—Kenisha V Ford
(74) *Attorney, Agent, or Firm*—Winston & Strawn LLP

(57) ABSTRACT

A method for reducing roughness of an exposed surface of an insulator layer on a substrate, by depositing an insulator layer on a substrate wherein the insulator layer includes an exposed rough surface opposite the substrate; treating the first substrate to form a zone of weakness beneath the insulator layer; and smoothing the exposed rough surface of the insulator layer by exposure to a gas plasma in a chamber. The chamber contains therein a gas at a pressure of greater than 0.25 Pa but less than 30 Pa, and the gas plasma is created using a radio frequency generator applying to the insulator layer a power density greater than 0.6 W/cm$^2$ but less than 10 W/cm$^2$ for at least 10 seconds to less than 200 seconds. Substrate bonding and layer transfer may be carried out subsequently to transfer the thin layer of substrate to the insulator layer and to a second substrate.

17 Claims, 5 Drawing Sheets

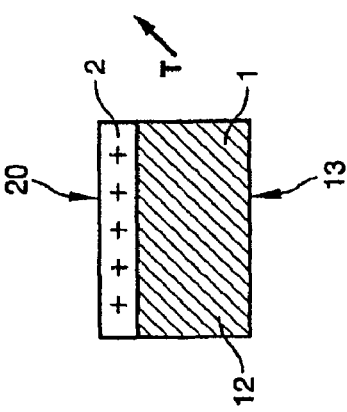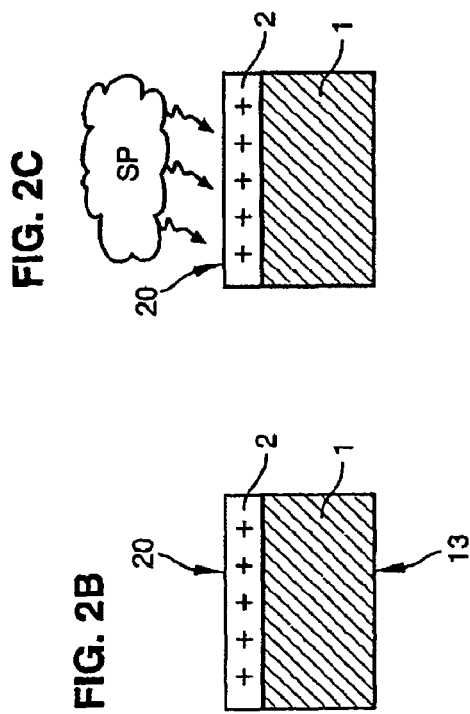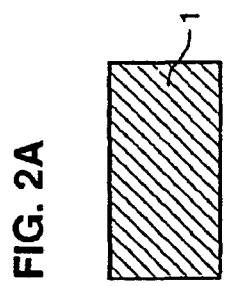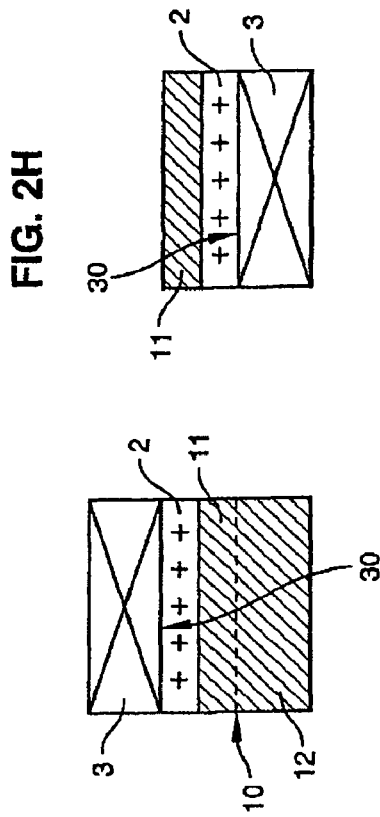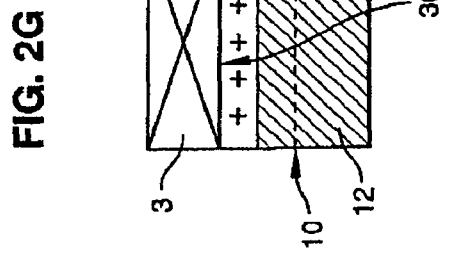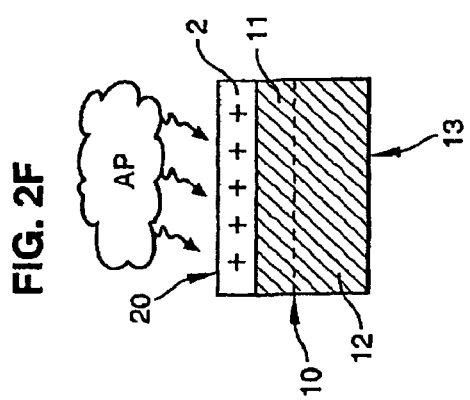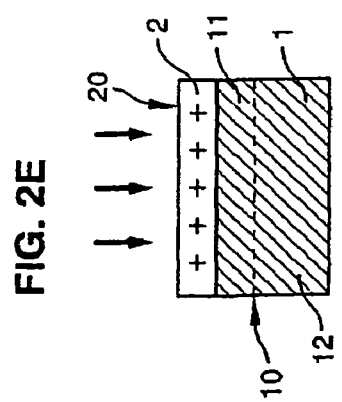

METHOD OF REDUCING ROUGHNESS OF A THICK INSULATING LAYER

BACKGROUND OF THE INVENTION

1. Field of the Invention

The present invention relates to a method of reducing the roughness of a thick insulator layer deposited on a substrate intended for use in the electronics, optoelectronics, or optics fields. The invention also relates to a method of bonding and transferring layers using the above-specified method. The invention is of particular application in the production of composite "substrate on insulator" type substrates.

2. Description of Related Art

Substrates known by the acronym "SOI" (substrate on insulator) correspond to substrates in which an insulator layer, such as silicon dioxide ($SiO_2$), is interposed between a support layer of silicon and a surface layer of silicon. Insulators can include oxides, nitrides, and oxynitrides.

One of the steps for producing an SOI involves bonding a "receiver" substrate onto the insulator layer. "Bonding" as used here is understood to mean bonding by molecular bonding, wherein two perfectly flat surfaces adhere to each other without the application of an adhesive, this being possible at ambient temperature. The quality of the bond obtained is characterized in particular by the bonding energy, which is defined as the binding force existing between the two layers bonded together. The quality of the bond may be improved by carrying out a suitable treatment of the surfaces to be bonded in order to provide a smoother bonding surface.

A technique for forming these substrates is known to persons in the art as "LPCVD TEOS," or "low pressure chemical vapor deposition—tetraethylorthosilicate." This involves depositing a layer of silicon dioxide on a support layer using a low pressure vapor phase deposition technique with tetraethylorthosilicate as the source material. This method enjoys a number of advantages with respect to the uniformity and density of the oxide layer obtained, and does not consume the substrate layer on which the formed silicon oxide lies. Oxides formed by a thermal oxidation technique often consume the substrate layer on which the formed oxide lies.

One of the disadvantages of the LPCVD TEOS technique, however, is that the layers of silicon dioxide deposited are significantly rougher than layers formed by thermal oxidation. For example, the surface roughness of a 150 nm (nanometer) thick TEOS layer may typically be more than 5 Å (angstroms) rms over scan widths of 1 μm (micrometer) by 1 μm, in contrast to a layer formed by thermal oxidation which typically may be about 1.50 Å rms.

Other deposition techniques are also known, such as LPCVD using silane ($SiH_4$) as a precursor, or plasma etch chemical vapor deposition (PCVD), for example. Reference in this regard should be made to the article by Wolf and Tauber, "Chemical vapor deposition of amorphous and polycrystalline films," Silicon processing for the VLSI era, Vol 1, pp 189-207, Method Technology. Unfortunately, these deposition techniques also lead to the production of insulator layers with very high roughness. Further, the roughness increases with the thickness of the deposited layer.

For that reason, production of a thick (i.e. more than 20 nm) insulator layer—typical for the fabrication of SOI type products—generally results in a degree of roughness which is incompatible with the constraints imposed by very high quality molecular bonding. Ideally, the roughness is preferably less than 5 Å rms to allow bonding, or even less than 2 Å rms over scan widths of 1 μm by 1 μm, in the context of a layer transfer application, known as the SMART-CUT® method.

The technique of subjecting a substrate to a plasma to modify the structure of the surface layer of the substrate is known in the art. "Plasma treatment" of a surface for bonding is defined as exposing that surface to a gas plasma—in particular under vacuum or at atmospheric pressure—prior to bringing the surfaces to be bonded into contact. The treatment is carried out by controlling various exposure parameters such as the nature and flow rate or pressure of the gas supplied to the chamber inside which the operation is carried out, as well as the power density. Two types of treatment can be distinguished: the first, termed "activation plasma," is known to promote the bonding energy between two layers. The second, termed "smoothing plasma," is intended to reduce the roughness of the surface of the treated layer. The plasma operation parameters, in particular energy, are different in the two cases.

An article by D. M. Hansen et al., "Chemical role of oxygen plasma in wafer bonding using borosilicate glasses," Applied Physics Letters, Volume 79, Number 21, 19 Nov. 2001, discloses a method of plasma activation of a thin borosilicate layer, deposited by LPCVD. Borosilicate type glasses are alloys of boron trioxide ($B_2O_3$) and silicon dioxide ($SiO_2$). The experiment reported in that article concerned the treatment of a borosilicate layer of about 30 Å (3 nm) with an oxygen plasma in RIE (reactive ion etching) mode, for five minutes, at 0.6 W/cm$^2$ (watts/square centimeter), with a pressure inside the chamber of 30 mTorr (1 mTorr=$1.33\times10^{-1}$ Pa). The results obtained reveal an improvement in bonding and showed that the roughness of the treated surface was not affected by the activation plasma treatment.

D. Pasquartello et al., in an article entitled "Surface energy as a function of self-bias voltage in oxygen plasma wafer bonding," Sensors and Actuators 82 (2000) 239-244, studied the influence of the kinetic energy of ions of an oxygen plasma on the bonding energy of silicon wafers. The tests showed that a silicon wafer having an initial roughness of 0.9 Å rms could achieve a roughness of close to 0.60 Å rms over 1×1 μm$^2$. The author also concluded that the kinetic energy of plasma ions had no influence whatsoever on the smoothing quality of substrates treated therewith.

Further, an article by H. Moriceau et al., "Interest of a short plasma treatment to achieve high quality Si—$SiO_2$—Si bonded structures," Abstract No. 1006, ECS 2003, showed the smoothing effect of a plasma on thermal oxides of $SiO_2$ with an initial roughness which was, however, fairly low (2.3 Å rms over 0.5×0.5 μm$^2$ to 20×20 μm$^2$). It was shown that fairly long exposure times to a plasma increased its smoothing effect.

While these articles show an improvement in the roughness of the surface of the substrate, those observed improvements occurred using films which started with very low roughness. Thus, there remains a need to eliminate the roughness of a thick insulator layer which is not to be or cannot be formed by oxidation of its starting substrate, and which has a high initial roughness. The present invention now satisfies this need.

SUMMARY OF THE INVENTION

The present invention relates to a method for reducing the roughness of a thick insulator layer deposited on a substrate intended for use in the electronics, optoelectronics or optics fields. It also allows bonding and subsequent transfer of the insulator layer without the necessity for mechanical polishing thereof.

In general, the method comprises depositing an insulator layer on a substrate wherein the insulator layer comprises an exposed rough surface opposite the substrate; treating the first substrate to form a zone of weakness the beneath the insulator layer; and smoothing the exposed rough surface of the insulator layer by exposure to a gas plasma in a chamber. The chamber contains therein a gas at a pressure of greater than 0.25 Pa but less than 30 Pa, and the gas plasma is created using a radio frequency generator applying to the insulator layer a power density greater than 0.6 W/cm$^2$ but less than 10 W/cm$^2$ for at least 10 seconds to less than 200 seconds. The term "rough" layer as used herein means a layer having a roughness in the range of about 3 Å rms to about 20 Å rms.

Other features of the invention, which may be taken alone or in combination, include:
- treating a substrate where the thickness of the insulator layer is 20 nm or more, preferably 200 nm or more;
- using a gas pressure inside the chamber in the range of 20 mTorr to 100 mTorr (3 Pa to 13 Pa), preferably close to 50 mTorr (about 7 Pa);
- using a plasma treatment duration in the range of about 30 to 120 seconds;
- selecting the gas used for plasma formation from oxygen ($O_2$), argon (Ar), nitrogen ($N_2$) or a mixture of the gases;
- forming the insulator by low pressure chemical vapor deposition, LPCVD;
- the insulator is an oxide, a nitride or an oxynitride;
- the oxide is a silicon dioxide ($SiO_2$), obtained by low pressure chemical vapor deposition (LPCVD) from tetraethylorthosilicate (TEOS); preferably deposited at a pressure in the range 300 mTorr to 1.5 Torr, i.e. in the range 40 Pa to 200 Pa;
- the deposition of the insulator is followed by a densification anneal at a temperature in the range 600° C. to 800° C.;
- the smoothing plasma treatment is carried out directly before the densification anneal.

The invention also provides a method of fabricating substrates intended for use in the fields of electronics, optoelectronics and optics, consisting of depositing an insulator layer, the roughness of which is 3 Å rms or more, onto a first substrate, comprising the steps of: reducing the roughness of the free surface of the insulator layer using one of the above-mentioned methods; molecular bonding of a second substrate onto the free surface of the insulator layer; and lifting off or detaching at least a portion, termed the "remainder," of one of the two substrates to transfer it to the other substrate.

Other embodiments of the invention, which may be taken alone or in combination, are as follows:
- the first substrate is a substrate termed the "donor" substrate, wherein a layer termed the "active" layer, which is derived from the donor substrate as well as an insulator layer, are detached and transferred to a second substrate termed the "receiver" substrate;
- a zone of weakness is formed inside a substrate termed the "donor" substrate to define an active layer of substrate material adjacent the insulator layer;
- the zone of weakness is formed inside the donor substrate by atomic species implantation;
- the smoothing plasma treatment is carried out before the implantation of the atomic species;
- the active layer comprises silicon;
- the active layer comprises strained silicon;
- after the smoothing plasma step, optionally after the densification anneal and before bonding, an activation plasma treatment of the insulator layer is carried out using a gas plasma formed in a chamber inside which a gas pressure of about 7 Pa is established, the plasma being created using a radiofrequency generator RF which functions at a power such that it can apply a power density of more than 0.2 W/cm$^2$ to the insulator layer, the period of the smoothing treatment being at least 5 seconds;
- the power density used is in the range of about 0.2 to 3 W/cm$^2$, and the treatment duration is in the range of about 5 to 60 seconds.

BRIEF DESCRIPTION OF THE DRAWINGS

Other characteristics and advantages of the invention will become apparent from the description herein made with reference to the accompanying drawings, wherein:

FIGS. 2A to 2H are diagrams illustrating the various steps of a second embodiment of the method of the invention.

DETAILED DESCRIPTION OF THE PREFERRED EMBODIMENTS

Figure 1A:
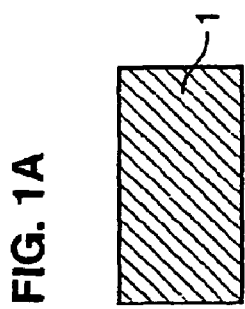
FIGS. 1A to 1F are diagrams illustrating the various successive steps of a first embodiment of the method of the invention.
Figure 1B:
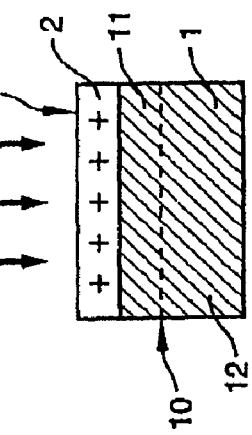

The present invention is directed to the treatment of the surface of an insulator layer, wherein the layer may be a nitride, oxynitride or preferably oxide. The insulator layer is supported by a substrate generally formed from a semiconductor material, for example silicon. The invention has particular application to the transfer of a thin layer of a semiconductor material, taken from a "donor" substrate, to a "receiver" substrate. The expression "thin layer" designates a layer a few tens or hundreds of nanometers thick.

In the transfer of thin layers, bonding is carried out between the insulator and the receiver substrate, or the donor surface, after a smoothing plasma treatment of the invention. Layer transfer may be carried out in accordance with the SMART-CUT® method, which employs a step for atomic species implantation intended to form a zone of weakness within the donor substrate to define the thin layer. Atomic species implantation techniques are well known to the skilled person and will not be described here in great detail. For a general description of atomic species implantation techniques and transfer methods, reference should be made to "Silicon on insulator technologies; Materials to VLSI", 2nd edition (Jean-Pierre COLINGE), and to literature regarding the SMART-CUT® method.

FIG. 1 shows the various steps in a first implementation of the method of the invention. FIGS. 1A and 1B respectively show a donor substrate 1 before and after it has been covered by the deposit of a thick insulator layer 2. The face 13 of the donor substrate 1 opposite to that on which the insulator layer 2 has been deposited is termed the "back face." The insulator layer 2 is formed on the donor substrate 1 (and optionally on the receiver substrate 3) by deposition, in particular vapor phase chemical deposition, and preferably at low pressure, which technique is known by the acronym LPCVD. Other techniques may be used, such as PECVD deposition. Reference in this regard may be made to the article by Wolf and Tauber cited above. This step of the method may be carried out with a reactor for chemical vapor phase deposition. This comprises a treatment chamber inside which the substrate is placed. The various chemical reagents, in the form of a gas stream, are then introduced into the chamber at a high temperature and low pressure, to form the insulator layer 2, after chemical reaction between the various gaseous constituents. One of the envisaged applications of the invention consists in fabricating a SOI type substrate. In a preferred embodiment, silicon dioxide ($SiO_2$) may be deposited by LPCVD using tetraethylorthosilicate (TEOS) in accordance with the following chemical reaction:

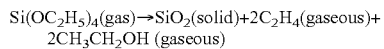

The pressure inside the chamber of the LPCVD reactor is in the range 300 mTorr to 1.5 Torr (40 Pa to 200 Pa), preferably close to 750 mTorr (100 Pa). The silicon dioxide thickness may be adjusted to be from at least 20 nm up to several micrometers.

Figure 1C:
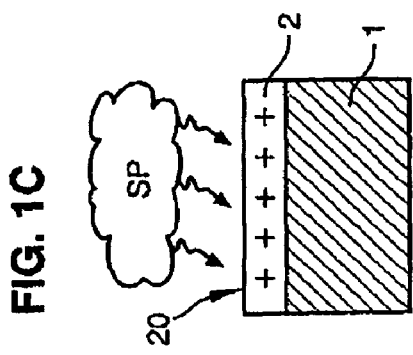

FIG. 1C illustrates the smoothing plasma step, the conditions for which will be described below. The reference SP corresponds to "smoothing plasma."

Figure 1D:
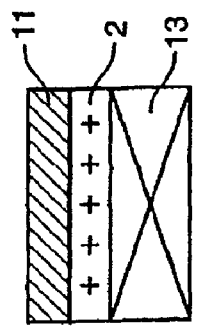
Figure 1E:
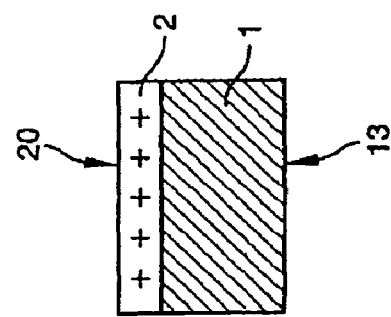

When the roughness reducing method of the invention is applied to layer transfer, an atomic species implantation step is carried out as shown in FIG. 1D. This implantation can form a zone of weakness 10 inside the donor substrate 1, which delimits an upper thin layer 11 from the remainder 12 of the substrate. The zone of weakness 10 could also be a porous layer, obtained, for example, by a method known as the "ELTRAN" method and elimination of the remainder 12 could be carried out by grinding and chemical etching.

Figure 1F:
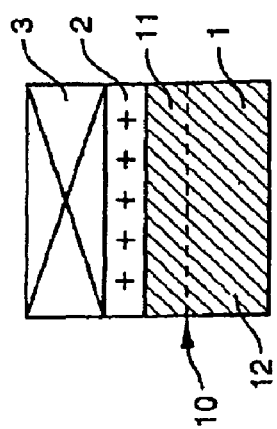
Figure 3:
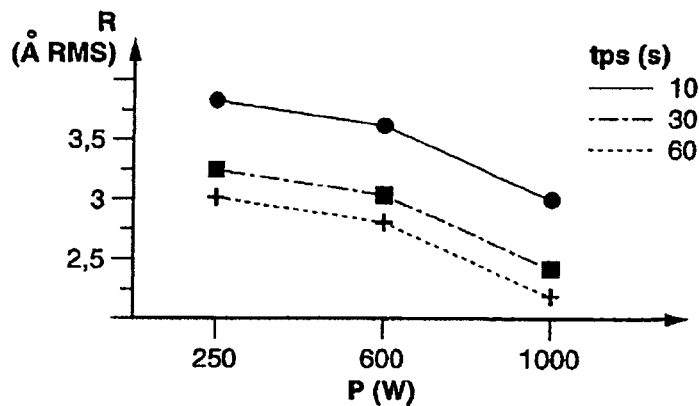
FIG. 3 is a graph showing the edge roughness R of a layer of silicon dioxide as a function of the applied power, after the plasma treatment of the invention, and for the various application periods.
Figure 4:
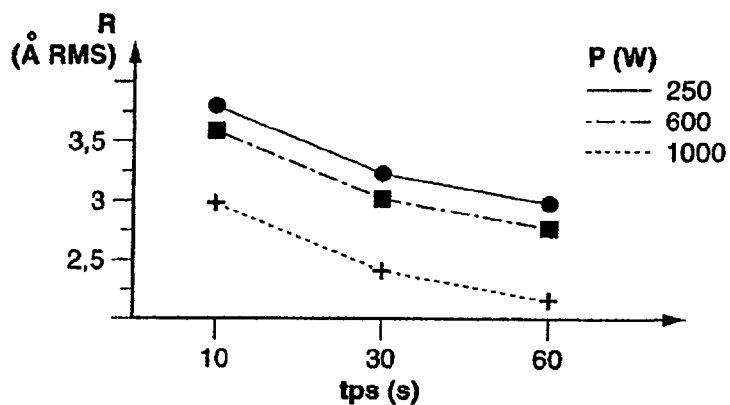
FIG. 4 is a graph showing the edge roughness R of a layer of silicon dioxide as a function of time, after the plasma treatment of the invention, and for various ranges of plasma power.
Figure 5:
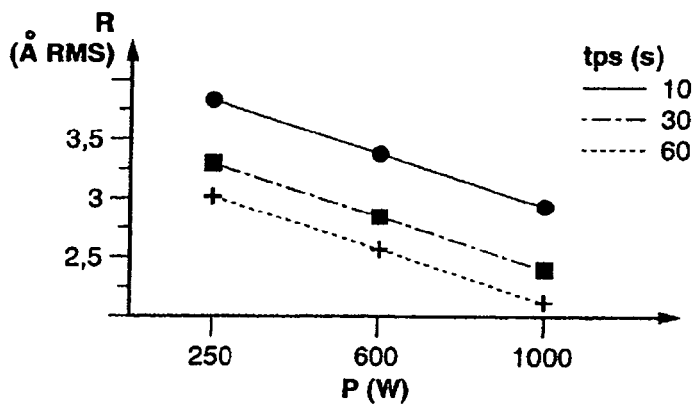
FIGS. 5 and 6 are graphs which are similar to those of FIGS. 3 and 4 respectively, but for measurements made in the centre of the silicon dioxide layer.
Figure 6:
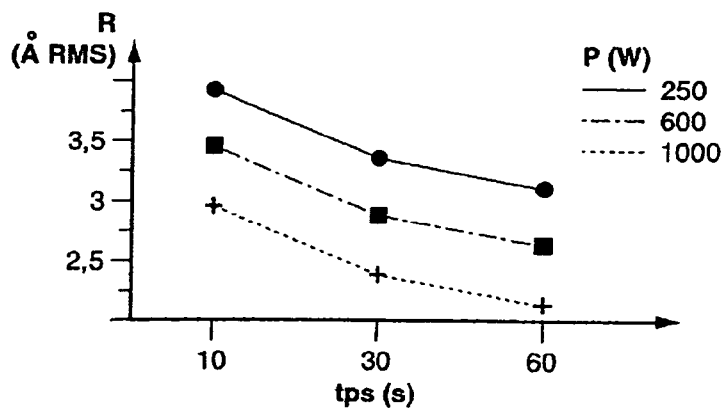

Finally, as shown in FIGS. lE and 1F, layer transfer is carried out by bonding a receiver substrate 3 to the free surface 20 of the insulator layer 2, treated as described above. Next, the remainder 12 is detached from the donor substrate 1 along the zone of weakness 10. The composite substrate shown in FIG. 1F is thus obtained, wherein an insulator layer 2 is interposed between two semiconductor materials layers 3, 11. Although not shown in the figures, it is understood that the donor and receiver substrates 1 and 3 may be formed from multiple layers.

FIG. 2 shows another embodiment of the method of the disclosed invention. Identical elements carry the same numerical references. In this embodiment, the smoothing plasma treatment may be followed by a densification heat treatment as shown in FIG. 2D. This step is optional but advisable. It is carried out by heat treatment at a temperature in the range 700° C. to 1000° C., for a period of several minutes to several hours, in an oxidizing or neutral atmosphere. The aim is to render the insulator denser and to eliminate carbon-containing species.

Further, after the atomic species implantation step shown in FIG. 2E, an activation plasma treatment is carried out, as shown in FIG. 2F. This activation treatment is optional. It may be carried out on the face which has undergone the smoothing plasma treatment, in this case face 20, or on the face 30 of the substrate 3 intended to be bonded to the face 20. It may also be carried out on the two faces 20 and 30. The reference AP corresponds to the term "activation plasma" which designates an activation plasma treatment. The last two steps of the method are identical to that for the embodiment illustrated in FIG. 1. In another embodiment, the insulator layer 2 may be deposited on the receiver substrate 3 (for example if it cannot be oxidized), and to subject it to the above-mentioned treatments.

Pre- and/or Post-activation Plasma Cleaning:

Deep cleaning of the surface to be activated may be carried out, for example using a chemical treatment known as "RCA" to avoid any contamination. "RCA" treatment consists in treating the surfaces in succession with the following:

a first solution known by the acronym "SC1" (standard clean 1), which comprises a mixture of ammonium hydroxide ($NH_4OH$), hydrogen peroxide ($H_2O_2$) and deionized water;

a second solution known by the acronym (SC2) (standard clean 2), which comprises a mixture of hydrochloric acid (HCl), hydrogen peroxide ($H_2O_2$) and deionized water.

Configuration of Unit for Carrying Out Smoothing Treatment or Activation Plasma Treatment:

The treatment is carried out with a unit comprising a plasma chamber inside which the pressure and composition of the gaseous atmosphere are controlled. Several types of those units exist. The invention may thus be implemented with a "reactive ion etching" unit known by its abbreviation, "RIE". The unit comprises a single RF (radiofrequency) generator supplying, via a capacitative coupling, an electrode located inside the chamber which supports the substrate 1 covered with the insulator layer 2 to be activated and/or smoothed. This single RF generator can generate the plasma (i.e. excite its species). The term "power" as used in the text, which is one of the activation parameters, corresponds more precisely to the power of the generator. Controlling the power of this generator can both excite the plasma and control the kinetic energy of the ions of the plasma which bombard the surface of the insulator layer 2 to be activated.

The plasma chamber also comprises a second electrode which is not connected to the substrate to be activated. This second electrode is earthed.

In a further variation, it is also possible to implement the invention with a similar unit to that which was mentioned above, but in which the second electrode is connected to a second RF generator. In this case, the second RF generator (connected to the electrode with which the insulator layer to be treated is not in contact) generates and maintains the plasma. This second generator is then programmed to control the density of the plasma. Controlling the power of the first generator can only regulate the kinetic energy of the ions of the plasma, which bombard the surface of the layer to be treated.

Smoothing Plasma Parameters:

The smoothing plasma treatment is necessarily carried out on the rough layer of the insulator and preferably before the SMART-CUT® implantation step. Preferably, this step is carried out directly after deposition and before densification. The RF power of the plasma is high. It is from 200 W to 3000 W, for substrates with a diameter of 200 mm, giving a power density of at least 0.6 W/cm², and preferably in the range 0.6 W/cm2 to 10 W/cm². It has been found that the higher the RF power for the plasma treatment, the lower the roughness of the insulator layer. The period of this plasma treatment is advantageously at least 10 seconds, preferably in the range 10 seconds to 200 seconds, typically in the range 30 seconds to 60 seconds. It has also been found that the longer the plasma treatment period, the smoother the surface of the insulator layer.

The gas used to form the plasma may be oxygen, nitrogen or argon or a combination of these gases ($Ar+O_2$; $Ar+N_2$; $O_2+N_2$; $Ar+O_2+N_2$). The smoothing treatment may also be carried out in two steps, for example, 60 seconds in argon plasma at high power, then 30 seconds in $O_2$ plasma at a more moderate power. The pressures typically used are over 2 mTorr, preferably in the range of 2 mTorr to 200 mTorr, preferably 20 mTorr to 100 mTorr, more preferably close to 50 mTorr (i.e. over 0.25 Pa, preferably in the range of 0.25 Pa to 30 Pa, preferably in the range of 3 Pa to 13 Pa, more preferably about 7 Pa).

While the smoothing plasma treatment is carried out at high energy and for a particularly long period, which is not necessarily compatible with obtaining strong bonding, the situation cannot be excluded in which the initial roughness and the choice of the face to be implanted could allow parameters of the method to be employed which function both for smoothing and for activation, in particular if smoothing is carried out in two steps as described above.

The smoothing plasma treatment may also optionally be stronger at the wafer edge (or respectively at the center) to obtain a uniform final roughness when the starting surface is rougher at the edge (or respectively the center). The skilled person will be aware of the parameters required to produce this type of differential (center/edge) correction in order to vary the plasma uniformity (pressure, center/edge power density differential, different flow rates between the center and the edge, etc).

Comparative Tests:

Test 1:

Tests were carried out on several substrates by varying the various plasma treatment parameters, to study the roughness of the treated insulator layer both at the center and at the edges. This roughness measurement was carried out using atomic force microscopy (AFM). The tests were carried out on an insulator layer formed of silicon dioxide, obtained by LPCVD TEOS. The thickness of the $SiO_2$ of the insulator layer was 145 nm and its initial roughness was of the order of 4 to 4.5 Å rms before smoothing plasma treatment. Plasma powers of 250, 600 and 1000 W were used for respective durations of 10, 30 and 60 seconds. The results are shown in the Table below for an oxygen plasma, for 200 mm diameter wafers.

TABLE 1

| Power used | Treatment period | Location of measurement | $2 \times 2\ \mu m^2$ rms [Å] |
|---|---|---|---|
| 250 W | 10 seconds | Center | 3.64 |
| | | Edge | 3.77 |
| | 30 seconds | Center | 3.53 |
| | | Edge | 3.29 |
| | 60 seconds | Center | 3.07 |
| | | Edge | 3.04 |
| 600 W | 10 seconds | Center | 3.64 |
| | | Edge | 3.66 |
| | 30 seconds | Center | 2.62 |
| | | Edge | 2.89 |
| | 60 seconds | Center | 2.37 |
| | | Edge | 2.39 |
| 1000 W | 10 seconds | Center | 3.29 |
| | | Edge | 3.63 |
| | 30 seconds | Center | 2.43 |
| | | Edge | 2.55 |

TABLE 1-continued

| Power used | Treatment period | Location of measurement | $2 \times 2\ \mu m^2$ rms [Å] |
|---|---|---|---|
| | 60 seconds | Center | 2.07 |
| | | Edge | 2.07 |

The roughness values are expressed in Angstroms rms over scan widths of 2 μm×2 μm. These results are also shown in the graphs of FIGS. 3 to 6, which show an initial improvement in roughness, this improvement being reinforced by the use of a high power smoothing plasma (preferably at least 600 W or, more preferably, 1000 W) and a long period.

At the end of this plasma treatment, It has been found that the silicon dioxide retained good uniformity. The reduction in roughness was real, was carried out at low temperature and avoided a subsequent chemical-mechanical polishing step. For this reason, the treated insulator layer may be used to produce very high quality bonding onto a receiver substrate and, subsequently, layer transfer by detachment which is also of high quality, which avoids any problems with blisters, exclusion zones ("rings"), specks or the formation of non-transferred zones.

Test 2:

Other complementary steps were carried out on strained silicon on insulator substrates (sSOI) with a smoothed TEOS oxide on strained silicon. In this case, the smoothing power was about 1000 W for about 60 s, for 200 mm diameter wafers. The results obtained are shown in the table below.

TABLE 2

| Densification | Nature of treatment | Location of treatment | $2 \times 2\ \mu m^2$ rms [Å] |
|---|---|---|---|
| NO | Reference | Center | 4.94 |
| | | Edge | 5.23 |
| | Smoothing plasma at 1000 W for 60 seconds | Center | 2.29 |
| | | Edge | 2.33 |
| YES | Implanted reference | Center | 5.37 |
| | | Edge | 6.3 |
| | Smoothing plasma at 1000 W followed by implantation | Center | 2.36 |
| | | Edge | — |

Figure 7:
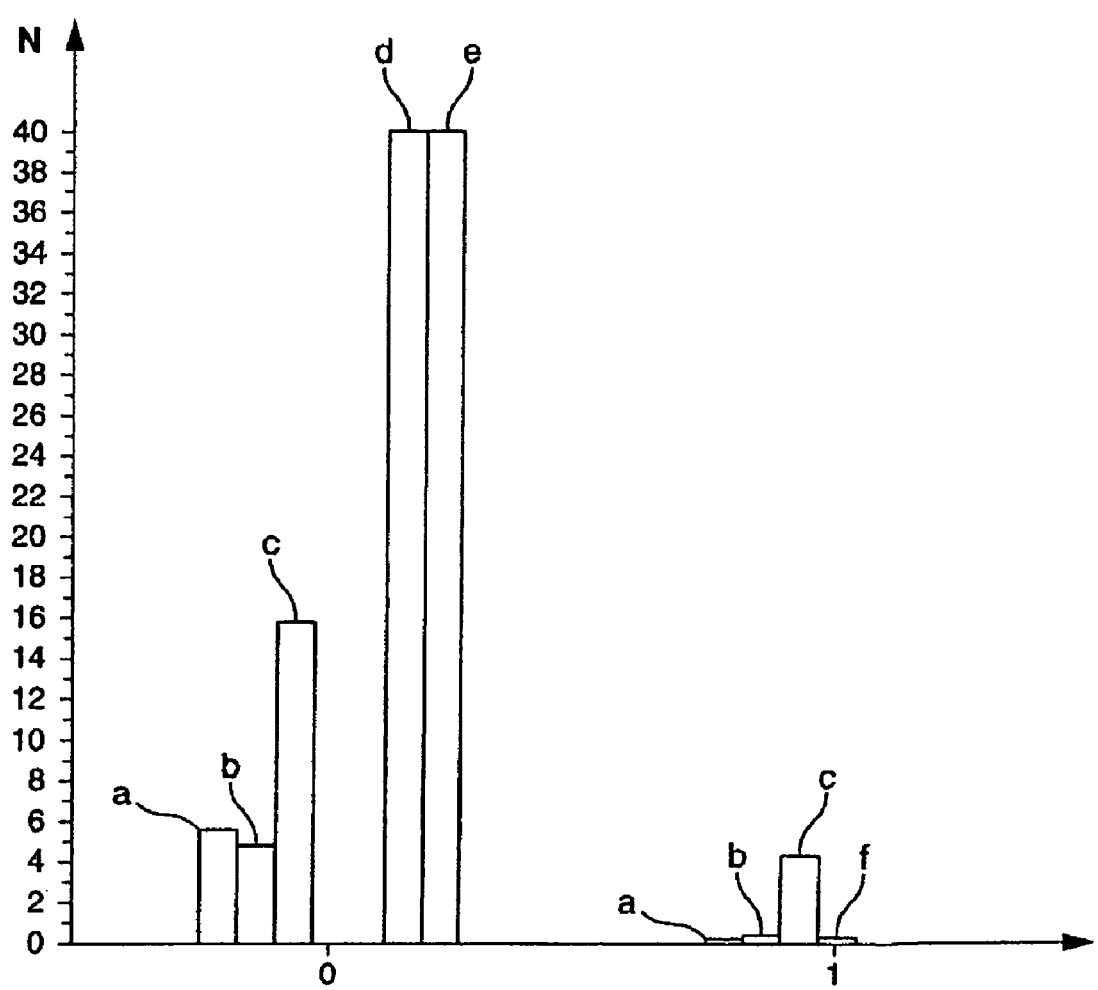
FIG. 7 is a graph representing the number N of various types of defects before and after the smoothing plasma treatment.

Further, comparative tests were also carried out on substrates after transfer of the thin layer 11 in the absence or in the presence of a smoothing plasma treatment. The results obtained are shown in FIG. 7, in which N represents the number of defects and 0 and 1 respectively indicate the absence of a smoothing plasma treatment or, in contrast, its presence. References a to f have the following meanings:

a: Non-transferred zone G (diameter more than 1.5 mm)

b: Non-transferred zone P (diameter between 0.5 and 1.5 mm)

c: Non-transferred zones p (diameter less than 0.5 mm)

d: blisters e: micro-blisters f: specks (non-transferred zones at wafer edge).

In this manner, defects the number of defects per wafer was reduced from about a hundred to about ten or even fewer using smoothing plasma.

Test 3:

Other tests were carried out to study the effect of smoothing plasma on the bonding time. The measurements made consisted in measuring the bonding time, i.e. the duration of a bonding wave between a silicon substrate covered with a layer of $SiO_2$ obtained by LPCVD and EOS and an acceptor substrate, also of silicon. The tests were carried out with different batches of substrates the oxides of which had different surface roughnesses, from 3 to 6 Angstroms rms, and which had undergone smoothing plasma using powers in the range 1000 W to 1500 W and for periods of 60 to 120 seconds. The substrates had a diameter of 200 mm.

Figure 8:
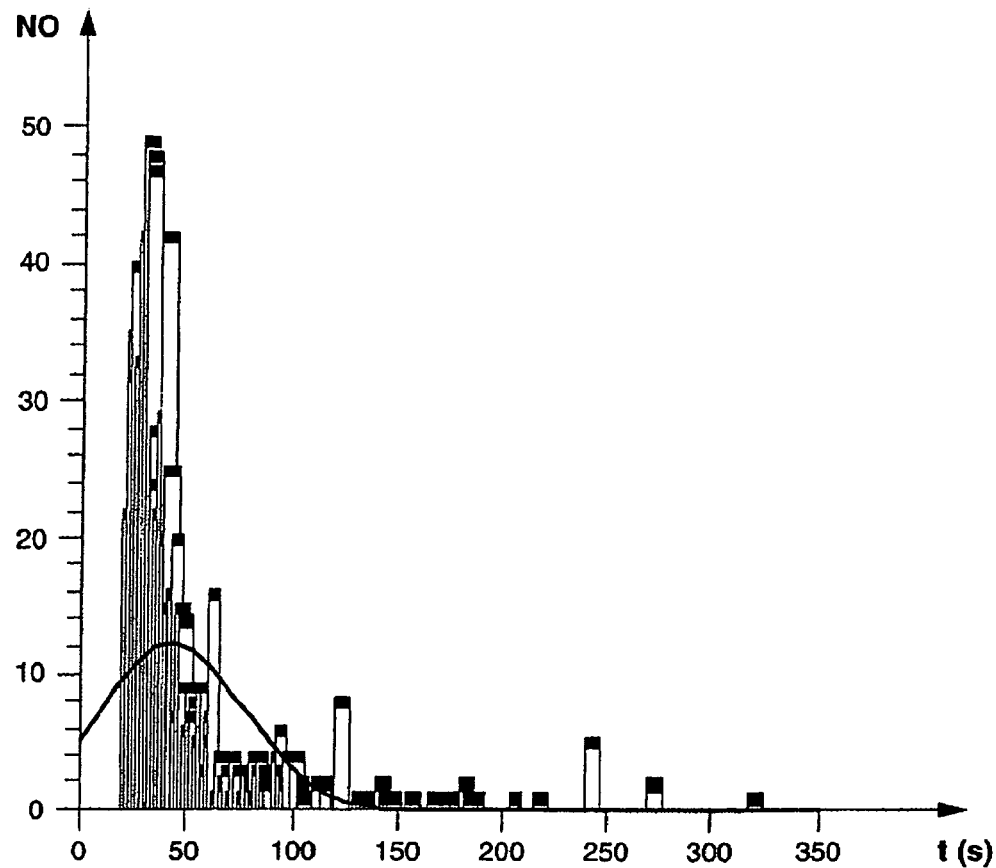
FIGS. 8 and 9 are graphs representing the duration t of a bonding wave, expressed in seconds, as a function of the number of bonding waves NO showing the bonding duration, respectively for insulator layers ($SiO_2$) which have not undergone smoothing plasma treatment or which have undergone it.

FIG. 8 shows the results obtained for oxides that had not undergone smoothing plasma treatment. It shows the duration t of a bonding wave, expressed in seconds, as a function of the number of bonding waves NO having that bonding duration.

Figure 9:
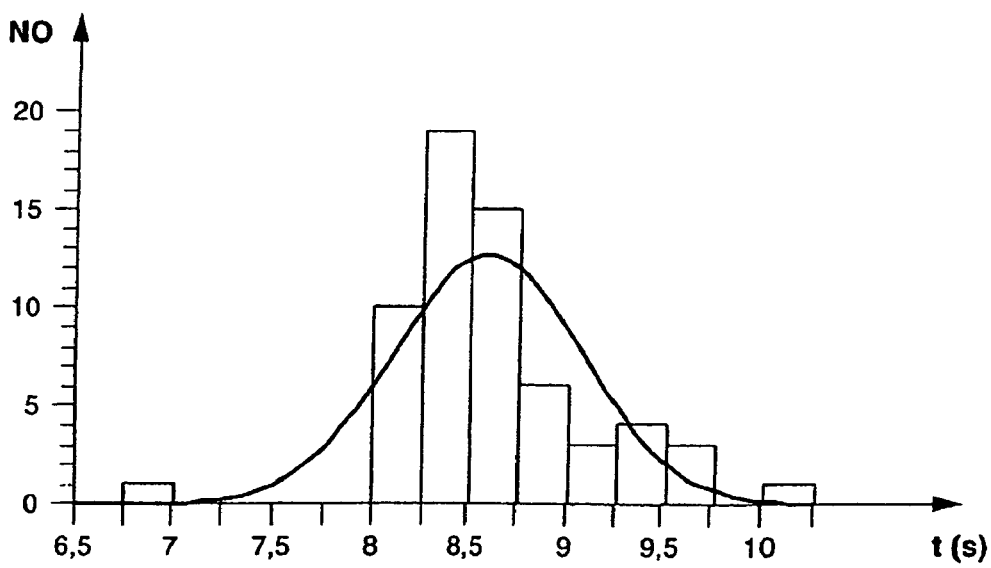

FIG. 9 shows the results obtained for oxides which have undergone the smoothing plasma treatment of the invention. It will be observed that when no smoothing plasma treatment has been carried out, the mean duration for the bonding wave or bonding time was 43.7 seconds with a standard deviation of 33 seconds, while after the smoothing plasma treatment, the bonding time was reduced to 8.6 seconds with a standard deviation of 0.5 seconds. Thus, smoothing plasma treatment reduces the bonding time and hence increases the bonding energy and renders that bond much more homogeneous and reproducible.

Activation Plasma Parameters:

As shown in FIG. 2F, it is possible to carry out a second activation plasma treatment which is then advantageously carried out at a much lower power, for example with an RF power density in the range of about 0.2 $W/cm^2$ to 3 $W/cm^2$, preferably close to 0.6 $W/cm^2$, to further increase the bonding energy with the receiver substrate. Preferably, a treatment period in the range of about 5 to 60 seconds and preferably about 30 seconds is used and the gas pressure inside the chamber can range between about 5 and 10 Pa (35 to 70 mTorr) and preferably is about 7 Pa (50 mTorr).

The previous detailed description provides non-limiting indications of possible implementations. It should be understood that the invention is not intended to be limited to the particular forms disclosed. Rather, the invention is to cover all modifications, equivalents, and alternatives falling within the spirit and scope of the invention as defined by the claims.

What is claimed is:

1. A method for reducing roughness of an exposed surface of an insulator layer on a substrate, which comprises:
   depositing an insulator layer on a first substrate wherein the insulator layer comprises an exposed rough surface opposite the substrate;
   treating the first substrate to form a zone of weakness beneath the insulator layer; and
   smoothing the exposed rough surface of the insulator layer by exposure to a gas plasma in a chamber, wherein the chamber contains therein a gas at a pressure of greater than 0.25 Pa but less than 30 Pa, with the gas plasma created using a radiofrequency generator applying to the insulator layer a power density greater than 0.6 $W/cm^2$ but less than 10 $W/cm^2$ for at least 10 seconds to less than 200 seconds.

2. The method of claim 1 wherein the gas pressure inside the chamber is in the range of 3Pa to 13 Pa.

3. The method of claim 1, wherein the gas plasma is created by the radiofrequency generator applying power for between 30 to 120 seconds.

4. The method of claim 1 wherein the gas plasma is formed from a gas selected from the group consisting of oxygen, argon, and nitrogen.

5. The method of claim 1, wherein the insulator layer is a nitride, oxynitride or oxide having a thickness that is between about 20 nm to several micrometers.

6. The method of claim 1 wherein the insulator layer is an oxide deposited on the substrate using low pressure chemical vapor deposition.

7. A method for reducing roughness of an exposed surface of an insulator layer on a substrate, which comprises:
   depositing an insulator layer on a first substrate wherein the insulator layer comprises an exposed rough surface opposite the substrate;
   treating the first substrate to form a zone of weakness beneath the insulator layer; and
   smoothing the exposed rough surface of the insulator layer by exposure to a gas plasma in a chamber, wherein the chamber contains therein a gas at a pressure of greater than 0.25 Pa but less than 30 Pa, with the gas plasma created using a radiofrequency generator applying to the insulator layer a power density greater than 0.6 $W/cm^2$ but less than 10 $W/cm^2$ for at least 10 seconds to less than 200 seconds,
   wherein the insulator layer is silicon dioxide formed from tetraethylorthosilicate using low pressure chemical vapor deposition at a pressure in the range of 40 Pa to 200 Pa.

8. The method of claim 1 which further comprises treating the insulator layer to a densification anneal at a temperature in the range from 600° C. to 800° C.

9. The method of claim 1 wherein the zone of weakness is formed inside the first substrate to define a layer of substrate material beneath the insulator layer.

10. The method of claim 9 wherein the zone of weakness is formed by implantation of atomic species and the smoothing is conducted prior to implantation of the atomic species.

11. The method of claim 9 wherein the exposed surface is sufficiently smooth to facilitate bonding to another substrate, and the method further comprises:
    bonding a second substrate to the insulator layer; and
    detaching the useful layer from the first substrate to transfer that layer and the insulator layer to the second substrate.

12. The method of claim 11 which further comprises:
    cleaning the exposed surface of the insulator layer; and
    treating the exposed surface of the insulator layer to an activation plasma.

13. The method of claim 12 wherein the activation plasma is formed in a chamber that contains a gas at a pressure of about 5 Pa to 10 Pa.

14. The method of claim 13 wherein the activation plasma is created using a radiofrequency generator applying to the insulator layer a power density of about 0.2$W/cm^2$ to about 3$W/cm^2$ for about 5 to 60 seconds.

15. The method of claim 12 wherein the cleaning of the exposed surface of the insulator layer comprises a chemical cleaning.

16. The method of claim 15 wherein the chemical cleaning of the exposed surface comprises treatment of the surface by an SC1 solution followed by treatment of the surface with an SC2 solution.

17. A method for reducing roughness of an exposed surface of an insulator layer on a substrate, which comprises:
    depositing an insulator layer on a substrate wherein the insulator layer comprises an exposed rough surface opposite the substrate;
    treating the first substrate to form a zone of weakness beneath the insulator layer; and
    smoothing the exposed rough surface of the insulator layer by exposure to a gas plasma in a chamber, wherein the chamber contains therein a gas at a pressure of greater than 0.25 Pa but less than 30 Pa, with the gas plasma created using a radiofrequency generator applying to the insulator layer a power density greater than 0.6 W/cm² but less than 10 W/cm² *for at least* 10 seconds to less than 200 seconds, wherein the exposed surface of the insulator layer is about 3 Å rms to 20 Å rms.

* * * * *

UNITED STATES PATENT AND TRADEMARK OFFICE
CERTIFICATE OF CORRECTION

PATENT NO. : 7,446,019 B2
APPLICATION NO. : 11/481701
DATED : November 4, 2008
INVENTOR(S) : Daval et al.

It is certified that error appears in the above-identified patent and that said Letters Patent is hereby corrected as shown below:

Column 11,
Line 3, change "$W/cm^{2\ for\ at\ least}$" to -- $W/cm^2$ for at least --.

Signed and Sealed this

Sixth Day of January, 2009

JON W. DUDAS
*Director of the United States Patent and Trademark Office*